(12) United States Patent
Shin et al.

(10) Patent No.: US 11,571,988 B2
(45) Date of Patent: Feb. 7, 2023

(54) HIGH-VOLTAGE RELAY SYSTEM FOR VEHICLE AND DIAGNOSTIC METHOD THEREFOR

(71) Applicants: Hyundai Motor Company, Seoul (KR); Kia Motors Corporation, Seoul (KR); Yura Corporation Co., Ltd., Gyeonggi-do (KR)

(72) Inventors: Sang Ho Shin, Gyeonggi-do (KR); Hae Sung Nam, Seoul (KR); Bum Kyo Jung, Gyeonggi-do (KR); Ho Kyung Kim, Gyeonggi-do (KR)

(73) Assignees: Hyundai Motor Company, Seoul (KR); Kia Motors Corporation, Seoul (KR); Yura Corporation Co., Ltd., Gyeonggi-do (KR)

( * ) Notice: Subject to any disclaimer, the term of this patent is extended or adjusted under 35 U.S.C. 154(b) by 759 days.

(21) Appl. No.: 16/566,392

(22) Filed: Sep. 10, 2019

(65) Prior Publication Data
US 2020/0298725 A1    Sep. 24, 2020

(30) Foreign Application Priority Data
Mar. 18, 2019   (KR) .................. 10-2019-0030575

(51) Int. Cl.
*H01H 47/26* (2006.01)
*H01H 50/12* (2006.01)
(Continued)

(52) U.S. Cl.
CPC ............. *B60L 58/12* (2019.02); *B60L 3/0046* (2013.01); *B60L 50/60* (2019.02);
(Continued)

(58) Field of Classification Search
CPC ........ B60L 3/0046; B60L 58/12; B60L 50/60; G01R 31/3275; G01R 31/3278
(Continued)

(56) References Cited

U.S. PATENT DOCUMENTS 8,063,506 B2 * 11/2011 Sakata ................. H02J 7/0031
307/10.7
8,964,339 B2 * 2/2015 Li ....................... H02H 11/001
361/42
(Continued)

FOREIGN PATENT DOCUMENTS

KR    10-2014-0078946 A    6/2014
KR    10-2016-0019306 A    2/2016
(Continued)

*Primary Examiner* — Jared Fureman
*Assistant Examiner* — Lucy M Thomas
(74) *Attorney, Agent, or Firm* — Fox Rothschild LLP (57) ABSTRACT

A high-voltage relay system for a vehicle is provided. The system includes a relay, a first contact part positioned between a battery and a power converter, a voltage application unit, and a second contact part positioned between the voltage application unit and the ground. A first resistor is connected, at a first end thereof, in series to a second end of the second contact part and connected, at a second end thereof, to the ground. A controller operates the relay in response to an ON/OFF control signal to short-circuit or open the contacts at both ends of the first contact part or the contacts at both ends of the second and determines whether the relay fails based on the type of the ON/OFF control signal and the voltage value between both ends of the first resistor.

17 Claims, 7 Drawing Sheets

(51) Int. Cl.
*B60L 58/12* (2019.01)
*B60L 50/60* (2019.01)
*B60L 3/00* (2019.01)
*G01R 31/327* (2006.01)

(52) U.S. Cl.
CPC ..... *G01R 31/3275* (2013.01); *G01R 31/3278* (2013.01); *B60L 2210/42* (2013.01); *B60L 2240/527* (2013.01)

(58) Field of Classification Search
USPC ........................................................ 361/211
See application file for complete search history.

(56) References Cited

U.S. PATENT DOCUMENTS

2012/0191294 A1* 7/2012 Boiron ............... G01R 31/3278
701/33.8
2013/0320986 A1* 12/2013 Shiraishi .............. G01R 31/327
324/415
2019/0128965 A1* 5/2019 Park ................. G01R 19/16542

FOREIGN PATENT DOCUMENTS

| KR | 10-2016-0107698 A | 9/2016 |
| KR | 10-2017-0060672 A | 6/2017 |
| KR | 20170097481 A | 8/2017 |

* cited by examiner

HIGH-VOLTAGE RELAY SYSTEM FOR VEHICLE AND DIAGNOSTIC METHOD THEREFOR

CROSS REFERENCE TO RELATED APPLICATION

The present application claims priority of Korean Patent Application No. 10-2019-0030575 filed on Mar. 18, 2019, the entire contents of which is incorporated herein for all purposes by this reference.

BACKGROUND

Field of the Invention

The present invention relates to a high-voltage relay system for a vehicle and a diagnostic method therefor, and, more particularly, to a high-voltage relay system for a vehicle, capable of diagnosing a failure of a relay in an ON or OFF state of the relay in a simplified structured system, and a diagnostic method therefor.

Description of the Related Art

An electric or hybrid vehicle is equipped with a high-voltage battery as a main power source for supplying electric power to a motor serving as a driving source, and includes a charging device configured to charge the battery, a power converter configured to operate the motor, and so on. The power converter drives the motor by phase-converting the power supplied from the high-voltage battery in response to the control signal of a motor control unit (MCU).

Figure 1:
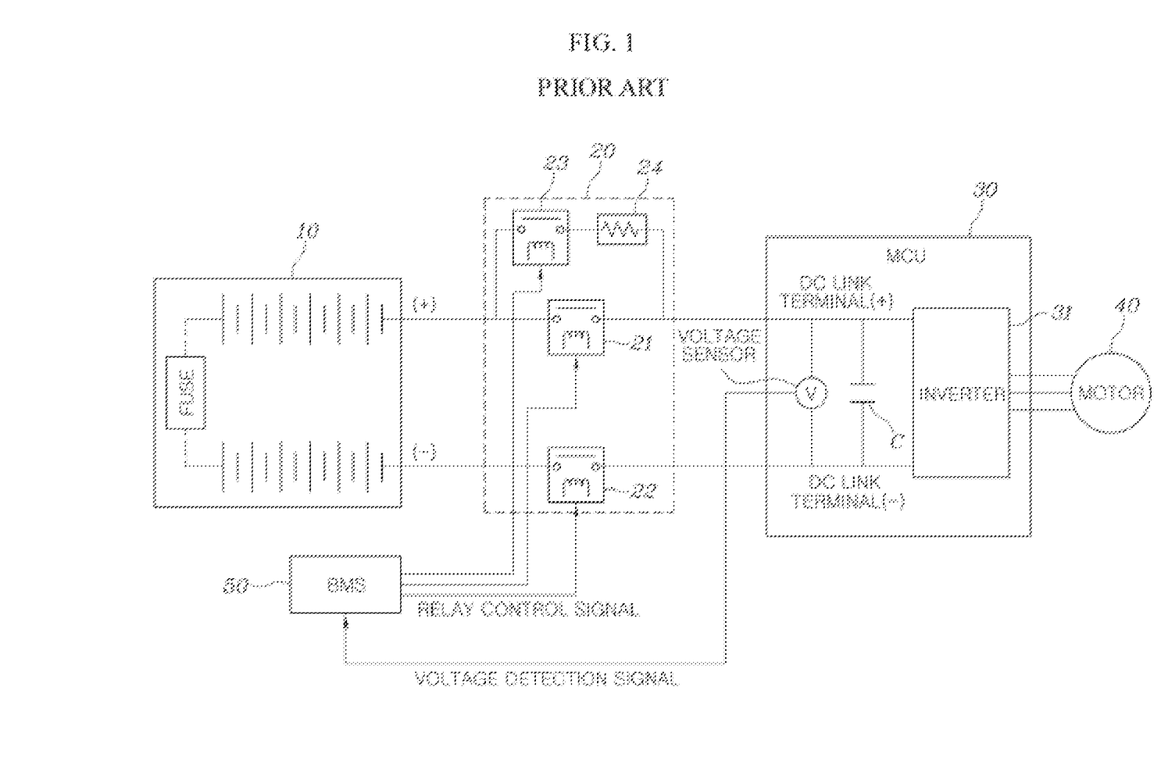
FIG. 1 is a diagram illustrating a high-voltage circuitry applied to a conventional electric or hybrid vehicle according to the related art.

FIG. 1 is a diagram schematically illustrating the configuration and connection of a high-voltage circuitry applied to a conventional electric or hybrid vehicle according to the related art. Referring to FIG. 1, a first main relay 21 is installed on a circuit between the positive terminal of a battery 10 and the positive terminal of a direct current (DC) link, a second main relay 22 is installed on a circuit between the negative terminal of the battery 10 and the negative terminal of the DC link, and a precharge relay 23 and a precharge resistor 24 are installed on a bypass circuit that bypasses the first main relay 21. The relays of the power relay assembly 20 are turned on/off in response to the relay control signal output from a battery management system (BMS) controller 50 or a motor control unit (MCU) 30.

These relays are problematic in that a failure including fusing or the like may occur. When a relay is fused, a high voltage is constantly exposed to the outside even during ignition (IG) off (e.g., parking), which may cause safety accidents such as electric shock. Therefore, to prevent safety accidents or the like, it is necessary to develop a technology capable of determining whether there is a failure including fusing of a relay or the like.

The foregoing is intended merely to aid in the understanding of the background of the present invention, and is not intended to mean that the present invention falls within the purview of the related art that is already known to those skilled in the art.

SUMMARY

Accordingly, the present invention provides a high-voltage relay system for a vehicle, capable of operating relays in response to ON/OFF control signals to short-circuit or open contacts at both ends of a first contact part or contacts at both ends of a second contact part by a corresponding relay, and capable of determining whether a corresponding relay fails based on the type of ON/OFF control signal and the voltage between both ends of a first resistor, and a diagnostic method therefor.

In accordance with one aspect of the present invention, a high-voltage relay system for a vehicle may include a first contact part positioned between a battery and a power converter of a vehicle, a second contact part positioned between a voltage application unit configured to apply a constant voltage and the ground, a relay disposed between the first contact part and the second contact part and short-circuited or opened, a first resistor disposed between the second contact part and the ground, and a controller that connects the relay to the first and second contact parts in response to an ON/OFF control signal.

Particularly, the controller may be configured to determine whether the relay fails based on the ON/OFF control signal and a voltage value between both ends of the first resistor. The high-voltage relay system may further include a voltage sensor configured to measure a voltage between both ends of the first resistor. When the measured voltage value between both ends of the first resistor, in a state in which the constant voltage is applied by the voltage application unit and the ON signal is applied to the relay, is "0", the controller may be configured to determine that the relay is normal.

When the measured voltage value between both ends of the first resistor, in a state in which the constant voltage is applied by the voltage application unit and the ON signal is applied to the relay, exceeds "0" and is a predetermined voltage value that is less than or equal to the voltage applied by the voltage application unit, the controller may be configured to determine that the relay is opened. Additionally, when the measured voltage value between both ends of the first resistor, in a state in which the constant voltage is applied by the voltage application unit and the OFF signal is applied to the relay, exceeds "0" and is a predetermined voltage value that is less than or equal to the voltage applied by the voltage application unit, the controller may be configured to determine that the relay is normal.

When the measured voltage value between both ends of the first resistor, in a state in which the constant voltage is applied by the voltage application unit and the OFF signal is applied to the relay, is "0", the controller may be configured to determine that the relay is short-circuit fused to the first contact part. The relay may be connected to at least one of positive and negative terminals of the battery.

The high-voltage relay system may further include a precharge relay and a precharge resistor connected in parallel to both ends of the relay and connected in series to each other. The high-voltage relay system may further include a first switch and a second switch connected in parallel to both ends of the relay and connected in series to each other. The relay may conduct only one of the first contact part and the second contact part. The voltage application unit may be configured to apply a constant voltage to the second contact part for failure diagnosis of the relay.

In accordance with another aspect of the present invention, a method of diagnosing a failure of a vehicle relay may include applying a constant voltage to a second contact part by a voltage application unit, applying an ON or OFF signal to a relay by a controller, measuring a voltage between both ends of a first resistor by a voltage sensor, and determining whether the relay fails based on the type of the signal applied to the relay by the controller and the measured voltage value between both ends of the first resistor.

In the determining of whether the relay fails, when the measured voltage value between both ends of the first resistor, in a state in which the constant voltage is applied by the voltage application unit and the ON signal is applied to the relay, is "0", the controller may be configured to determine that the relay is normal. In addition, when the measured voltage value between both ends of the first resistor, in a state in which the constant voltage is applied by the voltage application unit and the ON signal is applied to the relay, exceeds "0" and is a predetermined voltage value that is less than or equal to the voltage applied by the voltage application unit, the controller may be configured to determine that the relay is opened.

When the measured voltage value between both ends of the first resistor, in a state in which the constant voltage is applied by the voltage application unit and the OFF signal is applied to the relay, exceeds "0" and is a predetermined voltage value that is less than or equal to the voltage applied by the voltage application unit, the controller may be configured to determine that the relay is normal. In the determining of whether the relay fails, when the measured voltage value between both ends of the first resistor, in a state in which the constant voltage is applied by the voltage application unit and the OFF signal is applied to the relay, is "0", the controller may be configured to determine that the relay is short-circuit fused to the first contact part.

As apparent from the above description, in accordance with the present invention, it may be possible to control relays in response to ON/OFF control signals so that the contacts at both ends of the first contact part or the contacts at both ends of the second contact part are short-circuited or opened by a corresponding relay, and to more easily determine whether a corresponding relay fails based on the type of ON/OFF control signal and the voltage between both ends of the first resistor.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g. fuels derived from resources other than petroleum). As referred to herein, a hybrid vehicle is a vehicle that has two or more sources of power, for example both gasoline-powered and electric-powered vehicles.

Although exemplary embodiment is described as using a plurality of units to perform the exemplary process, it is understood that the exemplary processes may also be performed by one or plurality of modules. Additionally, it is understood that the term controller/control unit refers to a hardware device that includes a memory and a processor. The memory is configured to store the modules and the processor is specifically configured to execute said modules to perform one or more processes which are described further below.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/of" includes any and all combinations of one or more of the associated listed items.

Unless specifically stated or obvious from context, as used herein, the term "about" is understood as within a range of normal tolerance in the art, for example within 2 standard deviations of the mean. "About" can be understood as within 10%, 9%, 8%, 7%, 6%, 5%, 4%, 3%, 2%, 1%, 0.5%, 0.1%, 0.05%, or 0.01% of the stated value. Unless otherwise clear from the context, all numerical values provided herein are modified by the term "about."

A high-voltage relay system for a vehicle and a diagnostic method therefor according to the exemplary embodiments of the present invention will be described below with reference to the accompanying drawings.

Figure 2:
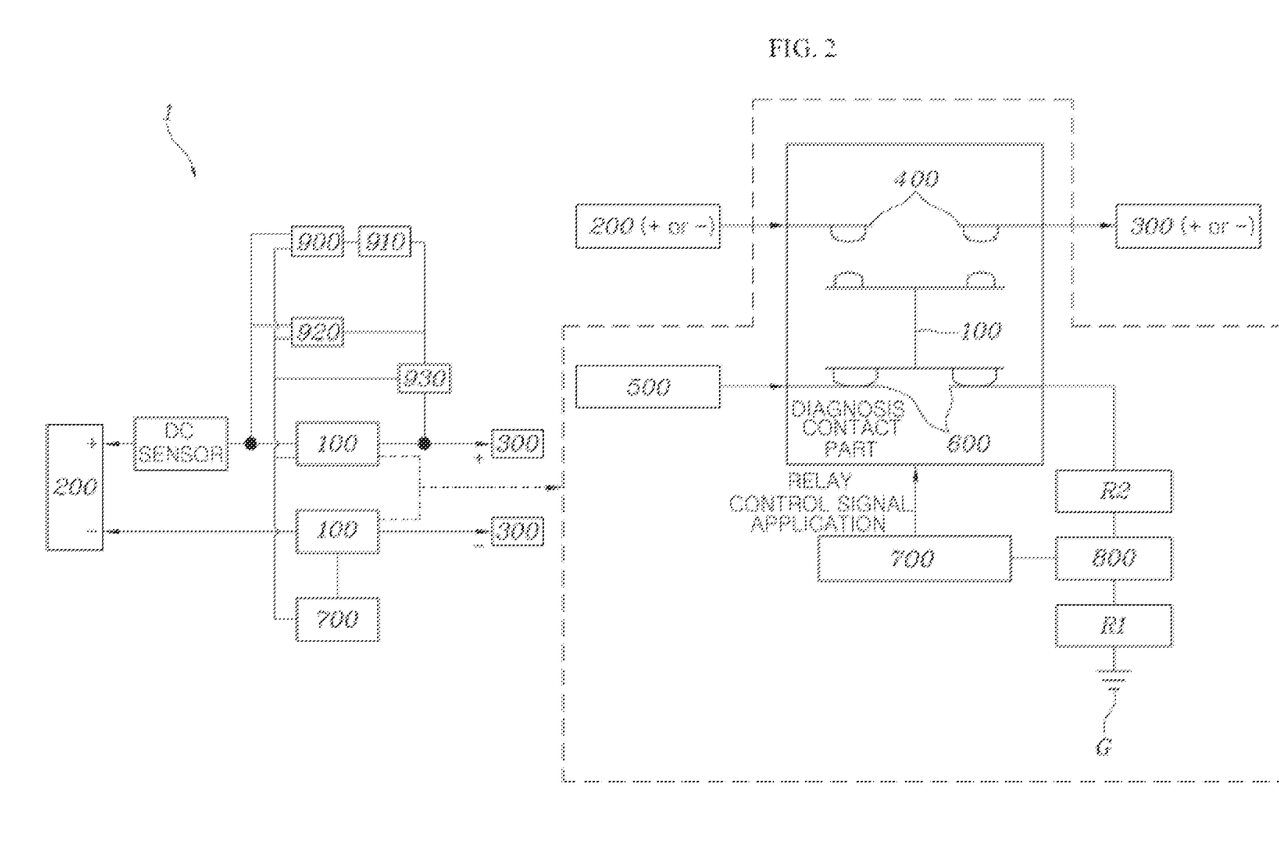
FIG. 2 is a diagram schematically illustrating an overall configuration of a high-voltage relay system for a vehicle according to an exemplary embodiment of the present invention.
Figure 3:
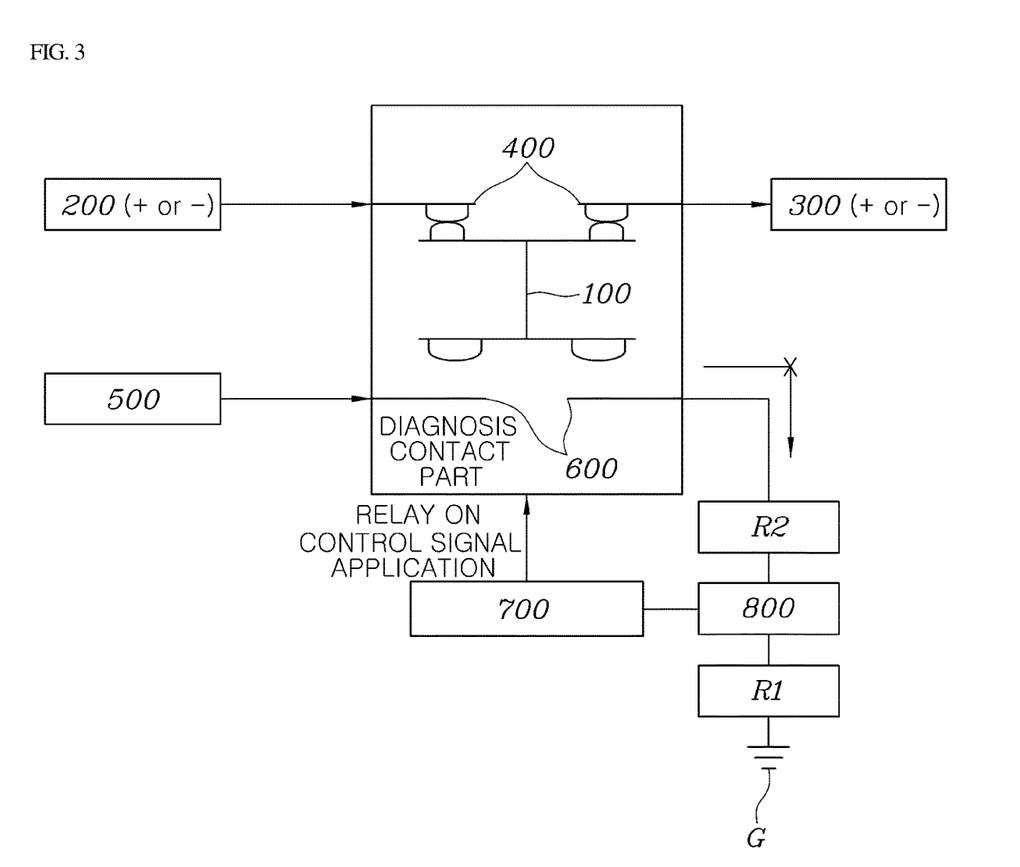
FIG. 3 is a diagram illustrating that a relay is normal in the state in which a constant voltage is applied by a voltage application unit and an ON signal is applied to the relay, in the high-voltage relay system for a vehicle according to the exemplary embodiment of the present invention.
Figure 4:
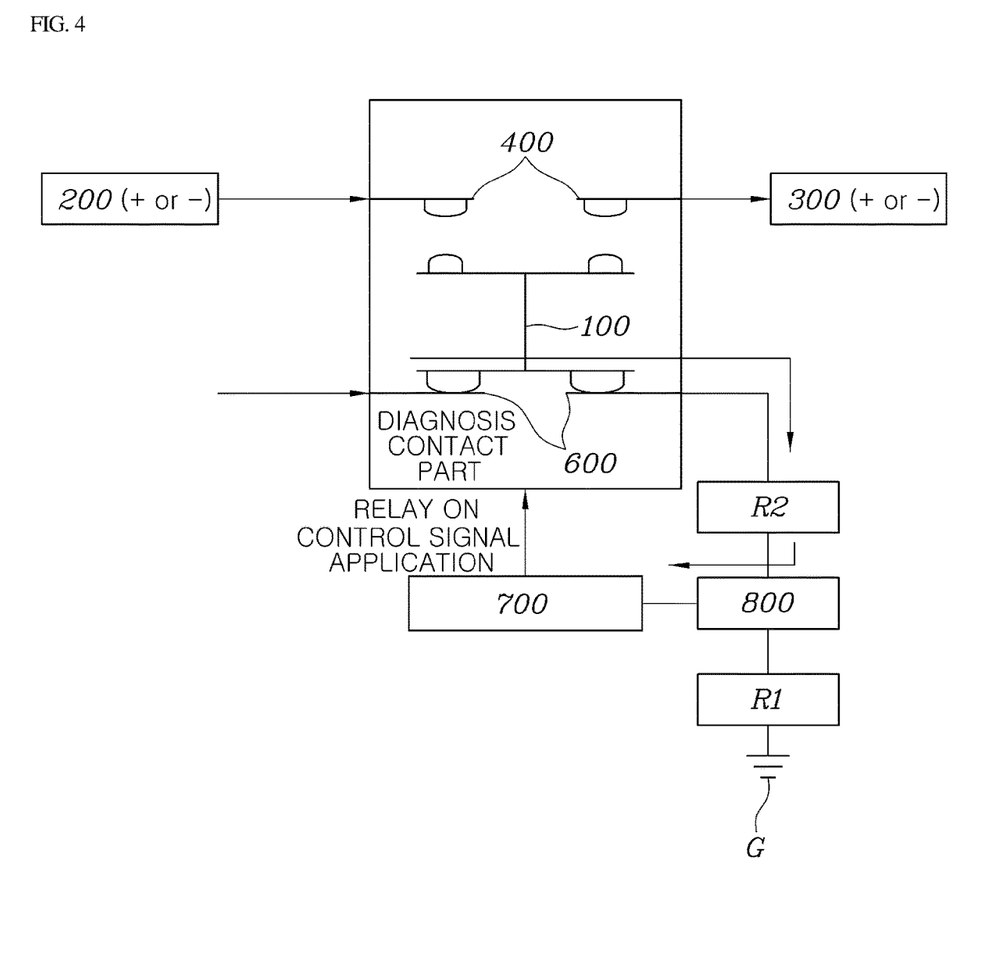
FIG. 4 is a diagram illustrating that a relay is opened in the state in which a constant voltage is applied by the voltage application unit and an ON signal is applied to the relay, in the high-voltage relay system for a vehicle according to the exemplary embodiment of the present invention.
Figure 5:
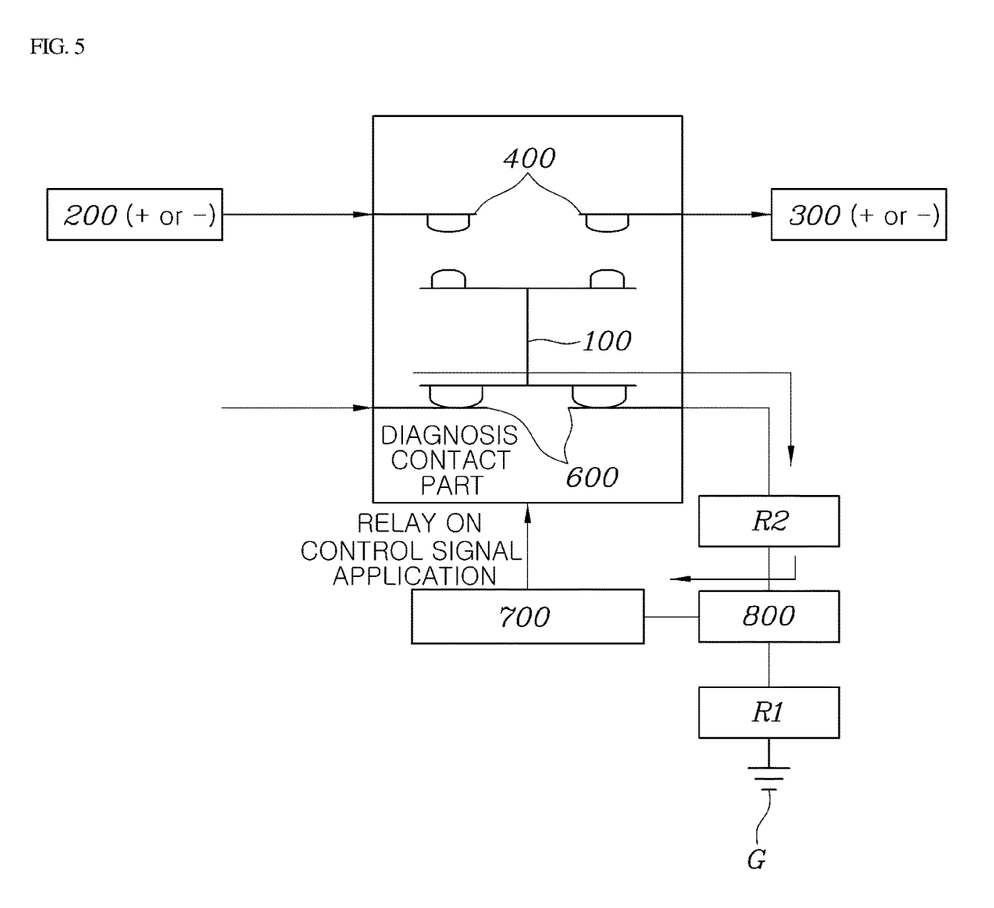
FIG. 5 is a diagram illustrating that a relay is normal in the state in which a constant voltage is applied by the voltage application unit and an OFF signal is applied to the relay, in the high-voltage relay system for a vehicle according to the exemplary embodiment of the present invention.
Figure 6:
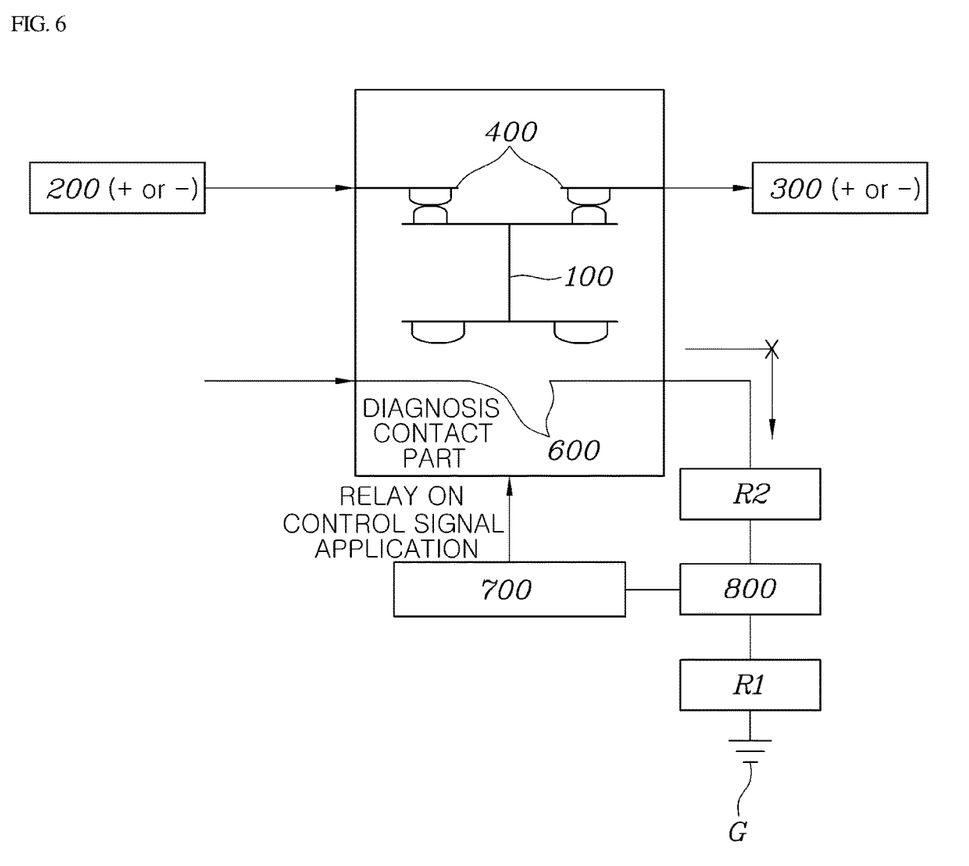
FIG. 6 is a diagram illustrating that a relay is short-circuit fused to a first contact part in the state in which a constant voltage is applied by the voltage application unit and an OFF signal is applied to the relay, in the high-voltage relay system for a vehicle according to the exemplary embodiment of the present invention.

FIG. 2 is a diagram schematically illustrating an overall configuration of a high-voltage relay system for a vehicle according to an exemplary embodiment of the present invention. FIG. 3 is a diagram illustrating that a relay is normal in the state in which a constant voltage is applied by a voltage application unit and an ON signal is applied to the relay. FIG. 4 is a diagram illustrating that a relay is opened in the state in which a constant voltage is applied by the voltage application unit and an ON signal is applied to the relay. FIG. 5 is a diagram illustrating that a relay is normal in the state in which a constant voltage is applied by the voltage application unit and an OFF signal is applied to the relay. FIG. 6 is a diagram illustrating that a relay is short-circuit fused to a first contact part in the state in which a constant voltage is applied by the voltage application unit and an OFF signal is applied to the relay.

As illustrated in FIG. 2, the high-voltage relay system for a vehicle, which is designated by reference numeral 1, according to the exemplary embodiment of the present invention may include a first contact part 400 disposed between a battery 200 and a power converter 300 of a vehicle, a second contact part 600 disposed between a voltage application unit 500 configured to apply a constant voltage and the ground, a relay 100 disposed between the first contact part 400 and the second contact part 600 and short-circuited or opened, a first resistor R1 disposed between the second contact part 600 and the ground G, and a controller 700 that connects the relay to the first and second contact parts 400 and 600 in response to an ON/OFF control signal and may be configured to determine whether the relay 100 fails based on the ON/OFF control signal and the voltage value between both ends of the first resistor R1.

The relay 100 may be a main relay of the vehicle, and may be a relay connected to at least one of the positive and negative terminals of the battery 200. In other words, the relay 100 may include a first main relay connected to the positive terminal of the battery 200 and a second main relay connected to the negative terminal of the battery 200. Specifically, the first and second relays 100 may be connected to the positive and negative terminals of the battery 200 of the vehicle, as illustrated in FIG. 2 in the exemplary embodiment. In the present invention, it may be possible to diagnose whether the respective first and second relays 100 connected to the positive and negative terminals of the battery 200 fail or malfunction. A detailed description thereof will be given while explaining the controller.

The relay 100 may be provided on the line that connects the first contact part 400 positioned between the battery 200 and the power converter 300 to the second contact part 600 positioned between the voltage application unit 500 and the ground G. In addition, the relay 100 may conduct only one of the first contact part 400 and the second contact part 600. Particularly, the relay 100 may be turned on or off in response to the ON/OFF control signal received from the controller 700 to short-circuit or open the contacts at both ends of the first contact part 400 or the contacts at both ends of the second contact part 600. Hereinafter, for convenience of description, it will be assumed that, in the state in which the relay 100 is normal, the contacts at both ends of the first contact part 400 are short-circuited when it receives an ON signal from the controller 700 whereas the contacts at both ends of the second contact part 600 are short-circuited when it receives an OFF signal from the controller 700.

In addition, the battery 200 of the vehicle may be a high-voltage battery configured to supply electric power for driving the motor of an electric or hybrid vehicle. The power converter 300 may include a plurality of switching elements, and may be configured to drive the motor mounted in the electric or hybrid vehicle by phase-converting the power supplied from the battery 200 in response to the control signal of a motor control unit (MCU) (not shown). Since driving the motor by phase-converting the power supplied from the high-voltage battery of the vehicle in the power converter is well known in the related art, a detailed description thereof will be omitted.

The voltage application unit 500 may be configured to apply a constant voltage to one end of the second contact part 600 for the failure diagnosis of the relay 100 and may be configured to apply a voltage of about 5 V to the second contact part 600 in the exemplary embodiment. The controller 700 may be a battery management system (BMS) controller or a motor control unit (MCU) in the exemplary embodiment. In addition, the controller 700 may be configured to operate the relay 100, and a precharge relay 900, a first switch 920, and a second switch 930, which will be described later, to apply an ON/OFF control signal thereto and be turned on or off. The controller 700 may be configured to determine whether the relay 100 fails based on the type of the control signal applied thereto and the measured value of a voltage sensor 800 configured to measure the voltage between both ends of the first resistor R1. The determination of whether the relay 100 fails in the controller 700 will be described later in more detail with reference to FIGS. 3 to 6.

Meanwhile, the high-voltage relay system for a vehicle 1 according to the exemplary embodiment of the present invention may further include a second resistor R2 disposed between the second contact part 600 and the first resistor R1, and a voltage sensor 800 configured to measure the voltage between both ends of the first resistor R1. In addition, the high-voltage relay system for a vehicle 1 according to the exemplary embodiment of the present invention may further include a precharge relay 900 and a precharge resistor 910 connected in parallel to both ends of the relay 100 and connected in series to each other. The precharge relay 900 may be selectively turned on or off in response to the control signal received from the controller 700.

Furthermore, the high-voltage relay system for a vehicle 1 according to the exemplary embodiment of the present invention may further include a first switch 920 and a second switch 930 connected in parallel to both ends of the relay 100 and connected in series to each other. The first and second switches 920 and 930 may be selectively turned on or off in response to the control signal received from the controller 700. In addition, the first and second switches 920 and 930 may be a semiconductor switching element and prevent surge, arc, etc. from occurring in the relay 100 when the relay 100 is turned on/off.

Meanwhile, the state of the relay 100 may be divided into three types. In other words, the state of the relay 100 may be divided into three types: a steady state; a short-circuit fused state; and an open state. Specifically, the steady state indicates that the relay 100 is in a normal state and operates in response to the control signal applied from the controller 700. The short-circuit fused state indicates that the relay 100 is fixed in a short-circuited state. Accordingly, when the relay 100 is short-circuit fused, the relay 100 may be maintained in the short-circuited state (turned-on state) irrespective of the control signal applied from the controller 700. The open state indicates the relay 100 is fixed in an open state. Accordingly, when the relay 100 is opened, the relay 100 may be maintained in the open state (turned-off state) irrespective of the control signal applied from the controller 700.

Hereinafter, the determination of whether the relay 100 fails in the controller 700 will be described in more detail with reference to FIGS. 3 to 6. FIG. 3 is a diagram illustrating that the relay is normal in the state in which a constant voltage is applied by the voltage application unit and an ON signal is applied to the relay. Specifically, in the state in which a constant voltage is applied to the second contact part 600 by the voltage application unit 500 and an ON signal is applied to the relay 100 by the controller 700, when the voltage value between both ends of the first resistor R1 measured by the voltage sensor 800 is "0", the controller 700 may be configured to determine that the relay 100 is normal. In particular, when the ON signal is applied to the relay 100 by the controller 700 in the state in which the relay 100 is normal, the relay 100 may operate so that the contacts at both ends of the first contact part 400 are short-circuited and both ends of the second contact part 600 are opened, with the consequence that the voltage between both ends of the first resistor R1 measured by the voltage sensor 800 may be "0".

FIG. 4 is a diagram illustrating that the relay is opened in the state in which a constant voltage is applied by the voltage application unit and an ON signal is applied to the relay. Specifically, in the state in which a constant voltage is applied to the second contact part 600 by the voltage application unit 500 and an ON signal is applied to the relay 100 by the controller 700, when the voltage value between both ends of the first resistor R1 measured by the voltage sensor 800 exceeds "0" and is a predetermined voltage value that is less than or equal to the voltage applied by the voltage application unit, the controller 700 may be configured to determine that the relay 100 is in an open state. In addition, when the ON signal is applied to the relay 100 by the controller 700 in the state in which the relay 100 is normal, the relay 100 may short-circuit the contacts at both ends of the first contact part 400. However, when the relay 100 is in the open state as illustrated in FIG. 4, the relay 100 may short-circuit the contacts at both ends of the second contact part 600 in spite of the ON signal applied from the controller 700, with the consequence that the voltage between both ends of the first resistor R1 measured by the voltage sensor 800 may exceed "0" and be the voltage applied by the voltage application unit. The above voltage is less than or equal to the voltage applied by the voltage application unit due to a voltage decrease caused by the resistance.

FIG. 5 is a diagram illustrating that a relay is normal in the state in which a constant voltage is applied by the voltage application unit and an OFF signal is applied to the relay. Specifically, in the state in which a constant voltage is applied to the second contact part 600 by the voltage application unit 500 and an OFF signal is applied to the relay 100 by the controller 700, when the voltage value between both ends of the first resistor R1 measured by the voltage sensor 800 exceeds 0 and is a predetermined voltage value that is less than or equal to the voltage applied by the voltage application unit, the controller 700 may be configured to determine that the relay 100 is normal. Notably, the predetermined voltage value may be about 4V. In addition, when the constant voltage is applied to the second contact part 600 by the voltage application unit 500 and the OFF signal is applied to the relay 100 by the controller 700 in the state in which the relay 100 is normal, the relay 100 may short-circuit the contacts at both ends of the second contact part 600 as illustrated in FIG. 5, with the consequence that the voltage between both ends of the first resistor R1 measured by the voltage sensor 800 may be equal to or greater than a particular voltage.

FIG. 6 is a diagram illustrating that the relay is fused to the first contact part in the state in which a constant voltage is applied by the voltage application unit and an OFF signal is applied to the relay. Specifically, in the state in which a constant voltage is applied to the second contact part 600 by the voltage application unit 500 and an OFF signal is applied to the relay 100 by the controller 700, when the voltage value between both ends of the first resistor R1 measured by the voltage sensor 800 is "0", the controller 700 may be configured to determine that the relay 100 is fused to the first contact part 400. When the OFF signal is applied to the relay 100 by the controller 700 in the state in which the relay 100 is normal, the relay 100 may short-circuit the contacts at both ends of the second contact part 600. However, when the relay 100 is fused to the first contact part 400 as illustrated in FIG. 6, the relay 100 may short-circuit the contacts at both ends of the first contact part 400 in spite of the OFF signal applied from the controller 700, with the consequence that the voltage between both ends of the first resistor R1 measured by the voltage sensor 800 may be "0".

Figure 7:
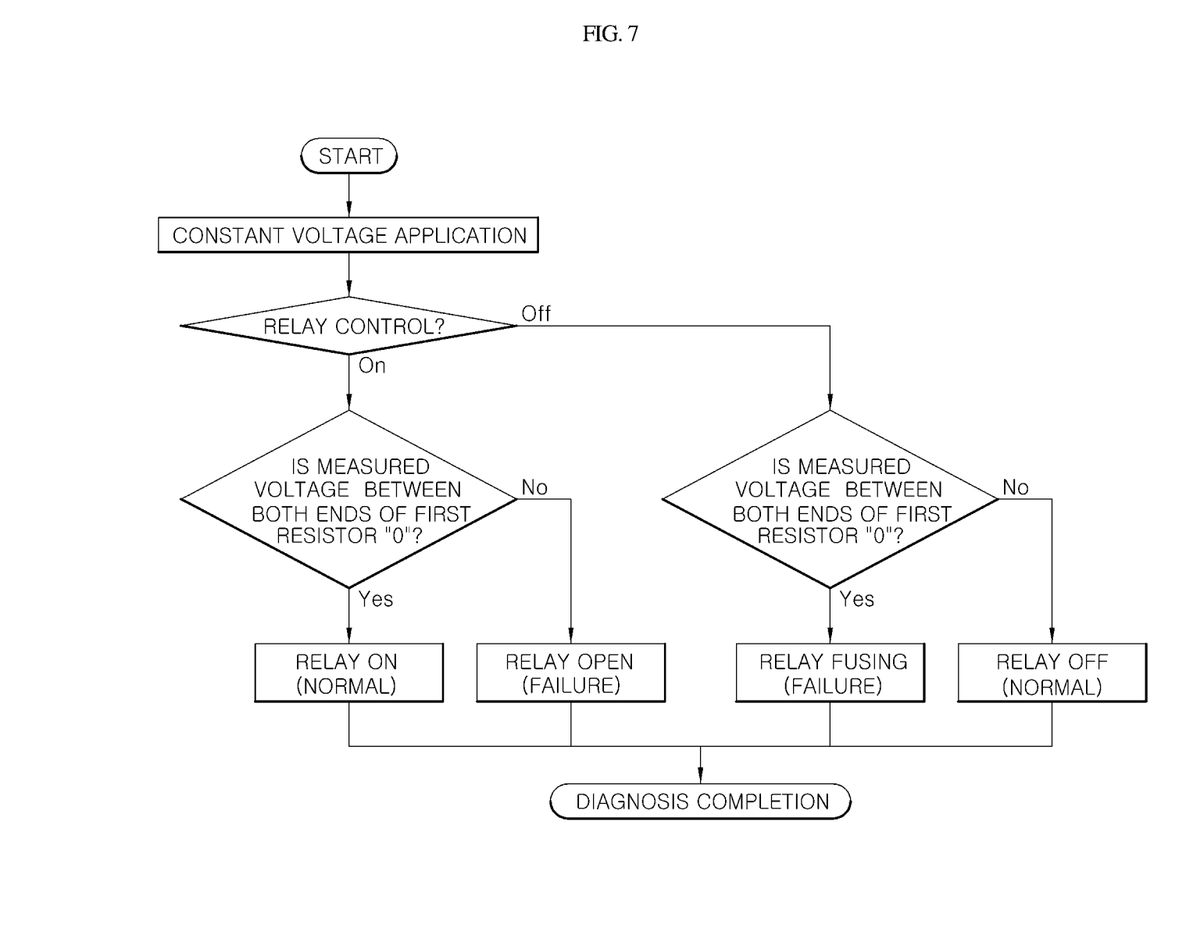
FIG. 7 is a flowchart illustrating a method of diagnosing a failure of a vehicle relay according to an exemplary embodiment of the present invention.

FIG. 7 is a flowchart illustrating a method of diagnosing a failure of a vehicle relay according to an exemplary embodiment of the present invention. The method described herein below may be generally executed by a controller configured to operate the various components of the system. Referring to FIG. 7, the method of diagnosing a failure of a vehicle relay according to the exemplary embodiment of the present invention may include applying, by a voltage application unit, a constant voltage to a second contact part, applying, by a controller, an ON or OFF signal to a relay, measuring, by a voltage sensor, the voltage between both ends of a first resistor, and determining, by the controller, whether the relay fails based on the type of the signal applied to the relay and the measured voltage value between both ends of the first resistor. For example, a relay failure may include the relay being shorted and as a result, the vehicle engine may be unable to be stopped. Accordingly, alerts related to such a failure may be output. As another example, a relay failure may include a relay opening failure and as a result, the engine may be unable to be started.

In particular, in the determination of whether the relay fails, when the measured voltage value between both ends of the first resistor in the state in which the constant voltage is applied by the voltage application unit and the ON signal is applied to the relay is "0", the controller may be configured to determine that the relay is normal. In addition, when the measured voltage value between both ends of the first resistor in the state in which the constant voltage is applied by the voltage application unit and the ON signal is applied to the relay exceeds "0" and is a predetermined voltage value that is less than or equal to the voltage applied by the voltage application unit, the controller may be configured to determine that the relay is opened.

When the measured voltage value between both ends of the first resistor in the state in which the constant voltage is applied by the voltage application unit and the OFF signal is applied to the relay exceeds "0" and is a predetermined voltage value that is less than or equal to the voltage applied by the voltage application unit, the controller may be configured to determine that the relay is normal. Further, when the measured voltage value between both ends of the first resistor in the state in which the constant voltage is applied by the voltage application unit and the OFF signal is applied to the relay is "0", the controller may be configured to determine that the relay is short-circuit fused to the first contact part.

Although the exemplary embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:
1. A high-voltage relay system for a vehicle, comprising:
    a first contact part disposed between a battery of the vehicle and a power converter of the vehicle;
    a second contact part disposed between a voltage application unit and ground, wherein the voltage application unit is configured to apply a constant voltage which is different from the voltage of the battery;

a relay disposed between the first contact part and the second contact part, wherein the relay is short-circuited or opened;

a first resistor disposed between the second contact part and the ground; and a controller that connects the relay to the first and second contact parts in response to an ON/OFF control signal.

2. The high-voltage relay system according to claim 1, wherein the controller is configured to determine whether the relay fails based on the ON/OFF control signal and a voltage value between both ends of the first resistor.

3. The high-voltage relay system according to claim 1, further comprising:

a voltage sensor configured to measure a voltage between both ends of the first resistor.

4. The high-voltage relay system according to claim 1, wherein when the measured voltage value between both ends of the first resistor, in a state in which the constant voltage is applied by the voltage application unit and the ON signal is applied to the relay, is 0, the controller is configured to determine that the relay is normal.

5. The high-voltage relay system according to claim 1, wherein when the measured voltage value between both ends of the first resistor, in a state in which the constant voltage is applied by the voltage application unit and the ON signal is applied to the relay, exceeds 0 and is a predetermined voltage value that is less than or equal to the voltage applied by the voltage application unit, the controller is configured to determine that the relay is opened.

6. The high-voltage relay system according to claim 1, wherein when the measured voltage value between both ends of the first resistor, in a state in which the constant voltage is applied by the voltage application unit and the OFF signal is applied to the relay, exceeds 0 and is a predetermined voltage value that is less than or equal to the voltage applied by the voltage application unit, the controller is configured to determine that the relay is normal.

7. The high-voltage relay system according to claim 1, wherein when the measured voltage value between both ends of the first resistor, in a state in which the constant voltage is applied by the voltage application unit and the OFF signal is applied to the relay, is 0, the controller is configured to determine that the relay is short-circuit fused to the first contact part.

8. The high-voltage relay system according to claim 1, wherein the relay is connected to at least one of positive and negative terminals of the battery.

9. The high-voltage relay system according to claim 1, further comprising:

a precharge relay and a precharge resistor connected in parallel to both ends of the relay and connected in series to each other.

10. The high-voltage relay system according to claim 1, further comprising:

a first switch and a second switch connected in parallel to both ends of the relay and connected in series to each other.

11. The high-voltage relay system according to claim 1, wherein the relay conducts only one of the first contact part and the second contact part.

12. The high-voltage relay system according to claim 1, wherein the voltage application unit is configured to apply the constant voltage to the second contact part for failure diagnosis of the relay.

13. A method of diagnosing a failure of a high-voltage relay system for a vehicle, wherein the system includes a first contact part disposed between a bettery of the vehicle and a power converter of the vehicle and a second contact part disposed between a voltage application unit and ground, the method comprising:

applying, by the voltage capplication unit, a constant voltage different from the voltage of the battery to the second contact part;

applying, by the controller, an ON or OFF signal to a relay, wherein the relay is disposed between the first contact part and the second contact part, and wherein the relay is short-circuited or opened;

measuring, by the controller, a voltage between both ends of a first resistor using a voltage sensor; and determining, by the controller, whether the relay fails based on the type of the signal applied to the relay and the measured voltage value between both ends of the first resistor.

14. The method according to claim 13, wherein in the determining whether the relay fails, when the measured voltage value between both ends of the first resistor, in a state in which the constant voltage is applied by the voltage application unit and the ON signal is applied to the relay, is "0", the controller is configured to determine that the relay is normal.

15. The method according to claim 13, wherein in the determining whether the relay fails, when the measured voltage value between both ends of the first resistor, in a state in which the constant voltage is applied by the voltage application unit and the ON signal is applied to the relay, exceeds 0 and is a predetermined voltage value that is less than or equal to the voltage applied by the voltage application unit, the controller is configured to determine that the relay is opened.

16. The method according to claim 13, wherein in the determining whether the relay fails, when the measured voltage value between both ends of the first resistor, in a state in which the constant voltage is applied by the voltage application unit and the OFF signal is applied to the relay, exceeds 0 and is a predetermined voltage value that is less than or equal to the voltage applied by the voltage application unit, the controller is configured to that the relay is normal.

17. The method according to claim 13, wherein in the determining whether the relay fails, when the measured voltage value between both ends of the first resistor, in a state in which the constant voltage is applied by the voltage application unit and the OFF signal is applied to the relay, is 0, the controller is configured to determine that the relay is short-circuit fused to the first contact part.

* * * * *